United States Patent
Tanaka

(10) Patent No.: US 6,505,335 B1
(45) Date of Patent: Jan. 7, 2003

(54) AUTOMATIC CELL PLACEMENT AND ROUTING METHOD AND SEMICONDUCTOR INTEGRATED CIRCUIT

(75) Inventor: Genichi Tanaka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 119 days.

(21) Appl. No.: 09/678,099

(22) Filed: Oct. 4, 2000

(30) Foreign Application Priority Data

Apr. 17, 2000 (JP) ....................... 2000-115570

(51) Int. Cl.$^7$ ............................. G06F 17/50
(52) U.S. Cl. .................. 716/13; 716/12; 716/10; 716/14; 716/9; 257/202; 257/698
(58) Field of Search ............................. 716/13, 14, 12, 716/10, 9, 8; 257/202

(56) References Cited

U.S. PATENT DOCUMENTS

| | | | | |
|---|---|---|---|---|
| 5,923,569 A | * | 7/1999 | Kumashiro et al. | 716/14 |
| 5,999,716 A | * | 12/1999 | Toyonaga | 716/10 |
| 6,014,506 A | * | 1/2000 | Hossain et al. | 716/11 |
| 6,058,252 A | * | 5/2000 | Noll et al. | 716/10 |
| 6,253,364 B1 | * | 6/2001 | Tanaka et al. | 716/10 |
| 6,363,516 B1 | * | 3/2002 | Cano et al. | 716/10 |
| 6,378,114 B1 | * | 4/2002 | Shenoy et al. | 716/7 |
| 6,414,852 B1 | * | 7/2002 | Mizuno | 257/698 |
| 6,417,529 B1 | * | 7/2002 | Tanaka | 257/202 |
| 2001/0011362 A1 | * | 8/2001 | Yoshinaga | 716/8 |

FOREIGN PATENT DOCUMENTS

| | | | | |
|---|---|---|---|---|
| JP | 2-43755 | 2/1990 | | H01L/21/82 |
| JP | 6-334043 | 12/1994 | | H01L/21/82 |
| JP | 02001298091 A | * | 4/2000 | H01L/21/82 |

* cited by examiner

Primary Examiner—Vuthe Siek
Assistant Examiner—Magid Y Dimyan
(74) Attorney, Agent, or Firm—Burns, Doane, Swecker & Mathis, LLP

(57) ABSTRACT

A logical net list of cells and nets through which the cells are connected with each other is prepared. The cells are composed of a timing-free cell, in which an input timing of a signal is not considered, and a plurality of timing-considered cells in which an input timing of a signal is considered. Also, dummy pin information is prepared to specify the timing-free cell because the design of a layout pattern of the timing-free cell is not desired. The correspondence of the dummy pin information to the logical net list is established to isolate the timing-free cell from the timing-considered cells by placing dummy pins on both sides of the timing-free cell. Thereafter, the correspondence of timing information to the logical net list is established to allocate timing information to each timing-considered cell, positions of the dummy pins in a layout pattern of the timing-considered cells to be designed are indicated by dummy pin layout-position information, and an automatic layout routing based on a timing driven layout technique is performed for the timing-considered cells. Accordingly, even though the timing-free cell is placed on a signal path with the timing-considered cells, a layout pattern of the timing-considered cells can be designed, a design time can be shortened, and a design efficiency can be improved.

34 Claims, 8 Drawing Sheets

AUTOMATIC CELL PLACEMENT AND ROUTING METHOD AND SEMICONDUCTOR INTEGRATED CIRCUIT

BACKGROUND OF THE INVENTION

1. Field of the Invention

The present invention relates to an automatic cell placement and routing method, in which cells to be arranged in a semiconductor integrated circuit are automatically placed to design a layout pattern of the cells, and a semiconductor integrated circuit in which timing considered cells automatically placed according to the automatic cell placement and routing method in the design of a layout pattern of the timing-considered cells are arranged with a timing-free-cell.

2. Description of Related Art

In cases where a plurality of timing-considered cells connected with each other on a signal path are to be arranged in a semiconductor integrated circuit on condition that an input timing of a signal input to each timing-considered cell is considered, it is required to design the layout pattern of the timing-considered cells according to timing constraints of the timing-considered cells. Therefore, in cases where the layout pattern of the timing-considered cells in the semiconductor integrated circuit is designed according to a conventional automatic cell placement and routing method (or called a place and route method) based on a timing driven layout technique, the timing constraints of the timing-considered cells are added to an automatic placement and routing tool, and a layout pattern of the timing-considered cells is designed so as to satisfy the timing constraints of the timing-considered cells.

However, in cases where a timing-free cell (for example, an asynchronous circuit), in which an input timing of a signal is not considered, is connected with the timing-considered cells on the signal path, it is impossible to design a layout pattern of the timing-considered cells and the timing-free cell according to the conventional automatic cell placement and routing method based on the timing driven layout technique while satisfying the timing constraints of the timing-considered cells.

FIG. 12 shows a plurality of cells placed on a signal path in a semiconductor integrated circuit. In FIG. 12, 21 indicates a timing-considered cell denoting a storing element such as a flip-flop or a latch. 22 indicates a timing-free cell in which an input timing of a signal is not considered. 23 indicates another timing-considered cell such as a combinational circuit. A signal passes through the cells 21, 22 and 23 placed on a signal path from the left side to the right side in FIG. 12. That is, a signal passing through the signal path is input to the first timing-considered cell 21 placed on the most left side, the first timing-considered cell 23, the timing-free cell 22, the second timing-considered cell 23 and the second timing-considered cell 21 placed on the most right side in that order. Each pair of cells adjacent to each other is connected with each other through a net. Each timing-considered cell has timing information indicating a timing constraint for a signal which is input to the timing-considered cell through a net. For example, a signal transmission delay time allowed for each timing-considered cell is considered within an allowable time range. Information of the set of the cells 21, 22 and 23 and a connection relationship among the cells 21, 22 and 23 connected with each other through nets are stored in a data base as a logical net list.

In the example of the cells 21, 22 and 23 shown in FIG. 12, because a net 24 connects the first timing-considered cell 21 and a signal input terminal (not shown) and because a net 25 connects the second timing-considered cells 21 and 23, it is required to design a layout pattern of cells 21, 22 and 23 placed on the signal path extending from the net 24 to the net 25 according to the conventional automatic cell placement and routing method based on the timing driven layout technique while using the logical net list and the timing information of the timing-considered cells and nets.

However, because no timing information of the timing-free cell 22 is prepared, a layout pattern of cells 21, 22 and 23 placed on the signal path from the net 24 to the net 25 cannot be designed according to the conventional automatic cell placement and routing method based on the timing driven layout technique. Therefore, it is required to manually check a signal transmission time period for each pair of timing-considered cells adjacent to each other.

As is described above, in cases where the timing-free cell having no timing information is placed on a signal path on which a plurality of timing-considered cells are placed, it becomes impossible to design a layout pattern of the timing-considered cells and the timing-free cell on the signal path according to the conventional automatic cell placement and routing method based on the timing driven layout technique, and it is required to manually design a layout pattern of the cells placed on the signal path while checking a transmission delay time of a signal for each timing-considered cell. Therefore, a design time required for the design of the layout pattern of the cells to be arranged in the semiconductor integrated circuit is lengthened, and there is a problem that a design efficiency for the design of the layout pattern of the cells is lowered.

SUMMARY OF THE INVENTION

An object of the present invention is to provide, with due consideration to the drawbacks of the conventional automatic cell placement and routing method, an automatic cell placement and routing method in which timing-considered cells to be arranged in a semiconductor integrated circuit is automatically placed at high speed in the design of a layout pattern of the timing-considered cells according to timing constraints of the timing-considered cells even though a timing-free cell is placed with the timing-considered cells on a signal path. Also, the object of the present invention is to provide a semiconductor integrated circuit in which timing-considered cells automatically placed according to the automatic cell placement and routing method in a layout pattern design are arranged with a timing-free cell.

The object is achieved by the provision of an automatic cell placement and routing method, comprising the steps of:

preparing a logical net list of a timing-free cell, a plurality of timing-considered cells and nets, through which the timing-free cell and the timing-considered cells are connected with each other, to be arranged in a semiconductor integrated circuit;

preparing dummy pin information to specify the timing-free cell written in the logical net list and to isolate the timing-free cell from the timing-considered cells and the nets by placing dummy pins on both sides of the timing-free cell;

preparing timing information indicating timing constraints of the timing-considered cells and the nets through which the timing-considered cells are connected a with each other; and performing an automatic layout routing for the timing-considered cells according to the logical net list, the dummy pin information and the timing information to design a layout pattern of the timing-considered cells to be arranged in the semiconductor integrated circuit.

Also, a semiconductor integrated circuit comprises:

the timing-considered cells in which an input timing of a signal is considered and which are placed on a signal path; and the timing-free cell in which an input timing of a signal is not considered and which is placed on the signal path on which the timing-considered cells are placed, wherein the layout pattern of the timing-considered cells is designed according to the automatic cell placement and routing method.

In the above steps of the automatic cell placement and routing method and the configuration of the semiconductor integrated circuit, the timing-free cell is isolated from the timing-considered cells by placing the dummy pins on both sides of the timing-free cell. Therefore, the timing-considered cells to be arranged in the semiconductor integrated circuit can be automatically placed in the design of a layout pattern of the timing-considered cells.

Accordingly, even though the timing-free cell having no timing information is placed on the signal path with the timing-considered cells respectively having timing information, a design time required for the design of a layout pattern of the timing-considered cells to be arranged in the semiconductor integrated circuit can be shortened, and a design efficiency for the design of the layout pattern of the timing-considered cells can be improved.

The object is also achieved by the provision of an automatic cell placement and routing method, comprising the steps of:

preparing a logical net list of a timing-free cell, a plurality of timing-considered cells and nets, through which the timing-free cell and the timing-considered cells are connected with each other, to be arranged in a semiconductor integrated circuit;

preparing dummy pin information to specify the timing-free cell written in the logical net list;

establishing the correspondence of the dummy pin information to the logical net list to place a dummy pin at a boundary between the timing-free cell and each timing-considered cell adjacent to the timing-free cell;

preparing timing information indicating timing constraints of the timing-considered cells and the nets through which the timing-considered cells are connected with each other;

establishing the correspondence of the timing information to the logical net list to allocate the timing information to the timing-considered cells written in the logical net list;

preparing dummy pin layout-position information indicating positions of the dummy pins in a layout pattern of the timing-considered cells;

performing a floor plan for the timing-considered cells according to the logical net list, the timing information and the dummy pin layout-position information; and performing an automatic layout routing for a result of the floor plan to design a layout pattern of the timing-considered cells in the semiconductor integrated circuit.

Also, a semiconductor integrated circuit comprises:

the timing-considered cells in which an input timing of a signal is considered and which are placed on a signal path; and the timing-free cell in which an input timing of a signal is not considered and which is placed on the signal path on which the timing-considered cells are placed, wherein the layout pattern of the timing-considered cells is designed according to the automatic cell placement and routing method.

In the above steps of the automatic cell placement and routing method and the configuration of the semiconductor integrated circuit, the timing-free cell is isolated from the timing-considered cells by placing the dummy pins at the boundaries between the timing-free cell and the group of timing-considered cells, and positions of the dummy pins in the layout pattern of the timing-considered cells are indicated by the dummy pin layout-position information. Therefore, the timing-considered cells to be arranged in the semiconductor integrated circuit can be automatically placed in the design of a layout pattern of the timing-considered cells.

Accordingly, even though the timing-free cell having no timing information is placed on the signal path with the timing-considered cells respectively having timing information, a design time required for the design of a layout pattern of the timing-considered cells to be arranged in the semiconductor integrated circuit can be shortened, and a design efficiency for the design of the layout pattern of the timing-considered cells can be improved.

The object is also achieved by the provision of an automatic cell placement and routing method, comprising the steps of:

preparing a logical net list of a timing-free cell, a plurality of timing-considered cells and nets, through which the timing-free cell and the timing-considered cells are connected with each other, to be arranged in a semiconductor integrated circuit;

preparing cell information of the timing-free cell for which the design of a layout pattern is not desired;

establishing the correspondence of the cell information to the logical net list to place a dummy pin at a boundary between the timing-free cell and each timing-considered cell adjacent to the timing-free cell;

preparing timing information indicating timing constraints of the timing-considered cells and the nets through which the timing-considered cells are connected with each other;

establishing the correspondence of the timing information to the logical net list to allocate the timing information to the timing-considered cells written in the logical net list;

preparing dummy pin layout-position information indicating positions of the dummy pins in a layout pattern of the timing-considered cells;

performing a floor plan for the timing-considered cells according to the logical net list, the timing information and the dummy pin layout-position information; and performing an automatic layout routing for a result of the floor plan to design a layout pattern of the timing-considered cells in the semiconductor integrated circuit.

Also, a semiconductor integrated circuit comprises:

the timing-considered cells in which an input timing of a signal is considered and which are placed on a signal path; and the timing-free cell in which an input timing of a signal is not considered and which is placed on the signal path on which the timing-considered cells are placed, wherein the layout pattern of the timing-considered cells is designed according to the automatic cell placement and routing method.

In the above steps of the automatic cell placement and routing method and the configuration of the semiconductor integrated circuit, the timing-free cell is specified by the cell information input by a user and is isolated from the timing-considered cells by placing the dummy pins at the boundaries between the timing-free cell and the group of timing-considered cells, and positions of the dummy pins in the layout pattern of the timing-considered cells are indicated by the dummy pin layout-position information. Therefore, the timing-considered cells to be arranged in the semiconductor integrated circuit can be automatically placed in the design of a layout pattern of the timing-considered cells.

Accordingly, even though the timing-free cell having no timing information is placed on the signal path with the timing-considered cells respectively having timing information, a design time required for the design of a layout pattern of the timing-considered cells to be arranged in the semiconductor integrated circuit can be shortened, and a design efficiency for the design of the layout pattern of the timing-considered cells can be improved.

The object is also achieved by the provision of an automatic cell placement and routing method, comprising the steps of:

preparing a logical net list of cells and nets, through which the cells are connected with each other, to be arranged in a semiconductor integrated circuit;

searching a cell library for cell information of each cell written in the logical net list;

automatically setting a specific cell, of which the cell information is not registered in the cell library or of which the cell information is insufficient in the cell library, as a timing-free cell for which the design of a layout pattern is not desired, the cells of the logical net list other than the specific cell being called timing-considered cells;

establishing the correspondence of a dummy pin to the logical net list to place the dummy pin at a boundary between the timing-free cell and each timing-considered cell adjacent to the timing-free cell;

preparing timing information indicating timing constraints of the timing-considered cells and the nets through which the timing-considered cells are connected with each other;

establishing the correspondence of the timing information to the logical net list to allocate the timing information to the timing-considered cells written in the logical net list;

preparing dummy pin layout-position information indicating positions of the dummy pins in a layout pattern of the timing-considered cells;

performing a floor plan for the timing-considered cells according to the logical net list, the timing information and the dummy pin layout-position information; and performing an automatic layout routing for a result of the floor plan to design a layout pattern of the timing-considered cells in the semiconductor integrated circuit.

Also, a semiconductor integrated circuit comprises:

the timing-considered cells in which an input timing of a signal is considered and which are placed on a signal path; and the timing-free cell in which an input timing of a signal is not considered and which is placed on the signal path on which the timing-considered cells are placed, wherein the layout pattern of the timing-considered cells is designed according to the automatic cell placement and routing method.

In the above steps of the automatic cell placement and routing method and the configuration of the semiconductor integrated circuit, the timing-free cell having no timing information is automatically specified by searching a cell library for cell information of each cell written in a logical net list, the timing-free cell is isolated from the timing-considered cells by placing the dummy pins at the boundaries between the timing-free cell and the group of timing-considered cells, and positions of the dummy pins in the layout pattern of the timing-considered cells are indicated by the dummy pin layout-position information. Therefore, the timing-considered cells to be arranged in the semiconductor integrated circuit can be automatically placed in the design of a layout pattern of the timing-considered cells.

Accordingly, even though the timing-free cell having no timing information is placed on the signal path with the timing-considered cells respectively having timing information, a design time required-for the design of a layout pattern of the timing-considered cells to be arranged in the semiconductor integrated circuit can be shortened, and a design efficiency for the design of the layout pattern of the timing-considered cells can be improved.

It is preferred that the step of establishing the correspondence of a dummy pin to the logical net list comprises the steps of:

placing end point information indicating an end point of a timing check at the boundary as the dummy pin in cases where the boundary is placed on an input pin side of the timing-free cell or in cases where a timing-considered cell, which drives a net connected with an input pin of the timing-free cell, is written in the logical net list; and placing start point information indicating a start point of a timing check at the boundary as the dummy pin in cases where the boundary is placed on an output pin side of the timing-free cell or in cases where a timing-considered cell, which drives a net connected with an output pin of the timing-free cell, is written in the logical net list.

In the above steps, a layout area of the timing-considered cells, for which a timing check is required, can be reliably determined according to the start point information and the end point information.

It is also preferred that the step of preparing dummy pin layout-position information includes:

indicating an absolute position of each dummy pin in the layout pattern as a first case, relative positions of the dummy pins in the layout pattern as a second case, absolute positions of a part of dummy pins or relative positions of a part of dummy pins as a third case or the combination of the first, second and third cases as a fourth case according to the dummy pin layout-position information, the step of performing a floor plan comprises the steps of:

placing the dummy pins in the layout pattern of the timing-considered cells according to the dummy pin layout-position information;

determining a layout area of the timing-considered cells; and performing the floor plan according to the timing information.

In the above steps, absolute positions of the dummy pins in the layout pattern, relative positions of the dummy pins in the layout pattern, absolute positions of a part of dummy pins or relative positions of a part of dummy pins or the combination of the above are indicated according to the dummy pin layout-position information. Therefore, the positions of the dummy pins can be reliably indicated.

It is also preferred that the step of preparing dummy pin layout-position information comprises the steps of:
  allocating a name to each dummy pin; and
  distinguishing the timing-free cell and a group of the timing-considered cells from each other according to the names.

In the above steps, the dummy pins can be distinguished from each other according to the names allocated to the dummy pins. Therefore, a layout area of the timing-considered cells can be reliably determined.

It is also preferred that the step of preparing dummy pin layout-position information further comprises the steps of;
  determining the whole area of the timing-free cell and the timing-considered cells to be arranged in the semiconductor integrated circuit;
  determining a position of the timing-free cell and a position of the group of timing-considered cells in the semiconductor integrated circuit according to a size of the timing-free cell and a size of the group of timing-considered cells; and
  placing the dummy pins at the boundaries between the timing-free cell and the group of timing-considered cells.

In the above steps, the position of the timing-free cell and the position of the group of timing-considered cells in the semiconductor integrated circuit are determined according to a size of the timing-free cell and a size of the group of timing-considered cells. Therefore, the timing-free cell and the group of timing-considered cells can be appropriately arranged in the semiconductor integrated circuit.

It is also preferred that the step of performing an automatic layout routing comprises the steps of:
  placing each of the cells written in the logical net list;
  determining positions of the dummy pins in the layout pattern of the cells according to relative positions of the cells;
  placing the dummy pins at the determined positions;
  performing a rough routing for the timing-considered cells according to the placement of the dummy pins; and
  performing a detailed routing for the timing-considered cells.

In the above steps, after the dummy pins are placed at the determined positions, a layout pattern of the timing-considered cells is designed in the rough routing and the detailed routing. Therefore, the layout pattern of the timing-considered cells can be reliably designed.

It is also preferred that the step of performing an automatic layout routing comprises the steps of:
  placing each of the cells written in the logical net list;
  performing a rough routing for the timing-considered cells;
  determining positions of the dummy pins in the layout pattern of the cells according to relative positions of the cells;
  placing the dummy pins at the determined positions; and
  performing a detailed routing for the timing-considered cells according to the placement of the dummy pins.

In the above steps, after the rough routing is performed, the dummy pins are placed at the determined positions, and a layout pattern of the timing-considered cells is designed in the detailed routing. Therefore, the layout pattern of the timing-considered cells can be reliably designed.

It is also preferred that the step of performing an automatic layout routing comprises the steps of:
  placing each of the cells written in the logical net list;
  performing a rough routing for the timing-considered cells;
  performing a detailed routing for the timing-considered cells;
  determining positions of the dummy pins in the layout pattern of the cells according to relative positions of the cells; and
  placing the dummy pins at the determined positions.

In the above steps, after the rough routing and the detailed routing are performed, the dummy pins are placed at the determined positions. Therefore, the layout pattern of the timing-considered cells can be reliably designed.

It is also preferred that the step of performing an automatic layout routing comprises the steps of:
  placing each of the cells written in the logical net list;
  determining positions of the dummy pins in the layout pattern of the cells according to relative positions of the cells;
  placing the dummy pins at the determined positions;
  performing a rough routing for the timing-considered cells according to the placement of the dummy pins;
  determining optimized positions of the dummy pins;
  changing the placement of the dummy pins to the optimized positions; and
  performing a detailed routing for the timing-considered cells.

In the above steps, after the rough is performed, the dummy pins are rearranged at the optimized positions, and the detailed routing is performed. Therefore, the layout pattern of the timing-considered cells can be reliably designed.

DETAILED DESCRIPTION OF THE PREFERRED EMBODIMENTS

The invention will now be described with reference to the accompanying drawings.

Embodiment 1

In an automatic cell placement and routing method according to a first embodiment, cells written in a logical net list are classified into a timing-free cell and a plurality of timing-considered cells, a user specifies the timing-free cell, the correspondence of dummy pin information to the logical net list is established to isolate the timing-free cell from the timing-considered cells by placing a dummy pin at a boundary between the timing-free cell and each timing-considered cell adjacent to the timing-free cell, and a timing driven layout routing is performed for the timing-considered cells so as to design a layout pattern of the timing-considered cells to be arranged in a semiconductor integrated circuit.

Figure 1:
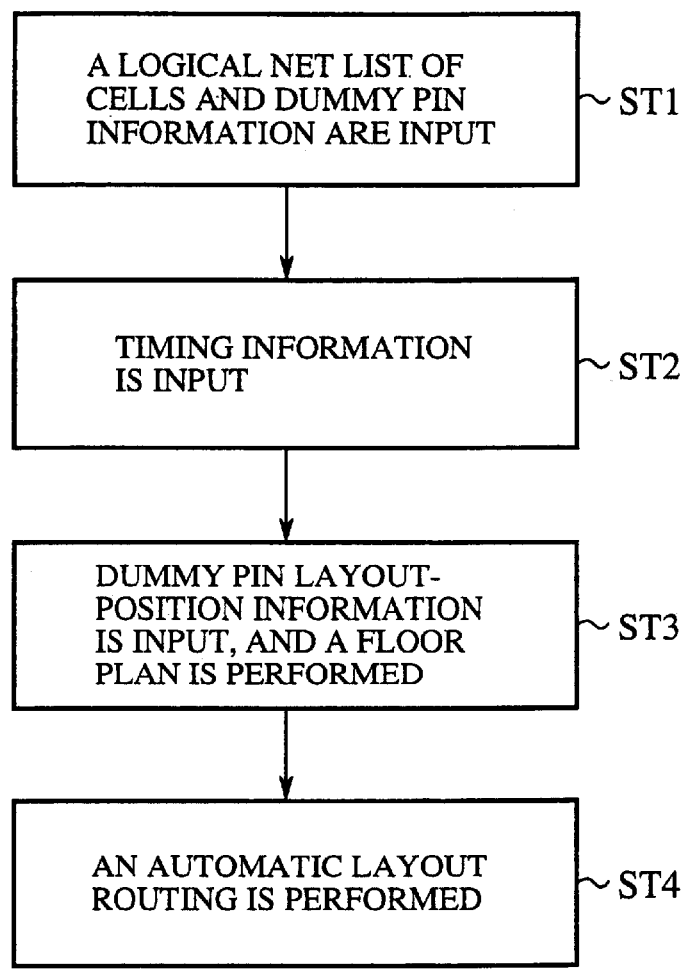
FIG. 1 is a flow chart showing an automatic cell placement and routing method according to a first embodiment of the present invention.

FIG. 1 is a flowchart showing an automatic cell placement and routing method according to a first embodiment of the present invention.

An automatic cell placement and routing method is described in detail with reference to FIG. 1.

As shown in FIG. 1, in a step ST1, a logical net list, which is prepared according to specifications of the configuration and functions of a semiconductor integrated circuit described in a hardware description language (HDL), is read out from a data base (not shown) and is input to a layout performing data file of a personal computer (not shown). The logical net list indicates information of a set of cells to be arranged in the semiconductor integrated circuit and information of a connection relationship among the cells connected with each other through nets. The cells can be classified into timing-considered cells, in which an input timing of a signal is considered, and a timing-free cell in which an input timing of a signal is not considered.

Figure 12:
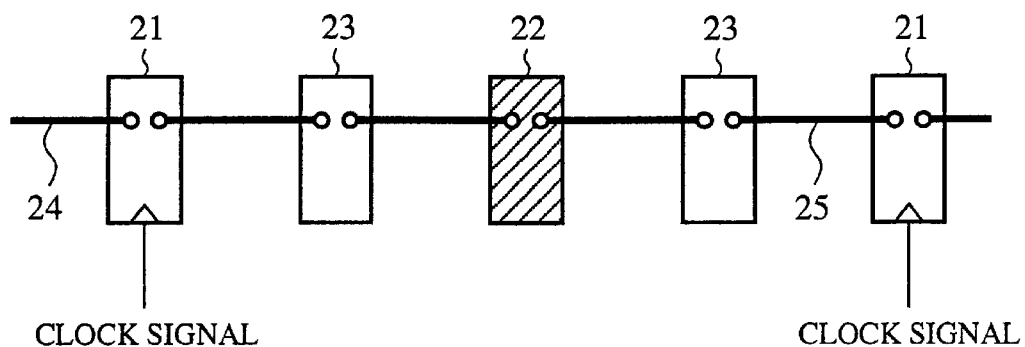
FIG. 12 shows a plurality of cells placed on a signal path in a semiconductor integrated circuit.

Also, a user reads out dummy pin information from the data base to specify the timing-free cell for which the user does not desire the design of a layout pattern according to a timing driven layout. The dummy pin information is composed of dummy pin position information and information indicating the number of dummy pins. The dummy pin position information indicates a relative position of the timing-free cell connected with the timing-considered cells through nets in the logical net list. Also, the dummy pin position information indicates that the timing-free cell is to be isolated from the timing-considered cells by placing a dummy pin at a boundary between the timing-free cell and each timing-considered cell adjacent to the timing-free cell. In the example shown in FIG. 12, the timing-free cell denotes the timing-free cell 22 because an input timing of a signal input to the timing-free cell 22 is not considered. In this case, it is applicable that the dummy pin information is prepared by a user.

Thereafter, the dummy pin information is input to the layout performing data file so as to establish the correspondence of the dummy pin information to the logical net list (step ST1). Therefore, a dummy pin is written in the logical net list to be placed at a boundary between the timing-free cell and each timing-considered cell adjacent to the timing-free cell, and the logical net list indicates that the timing-considered cells and nets, through which the timing-considered cells are connected with each other, are isolated from the timing-free cell through the dummy pins. Here, a layout pattern of the timing-considered cells and the nets is expected to be designed according to a timing driven layout, and a layout pattern of the timing-free cell is not expected to be designed.

Figure 2:
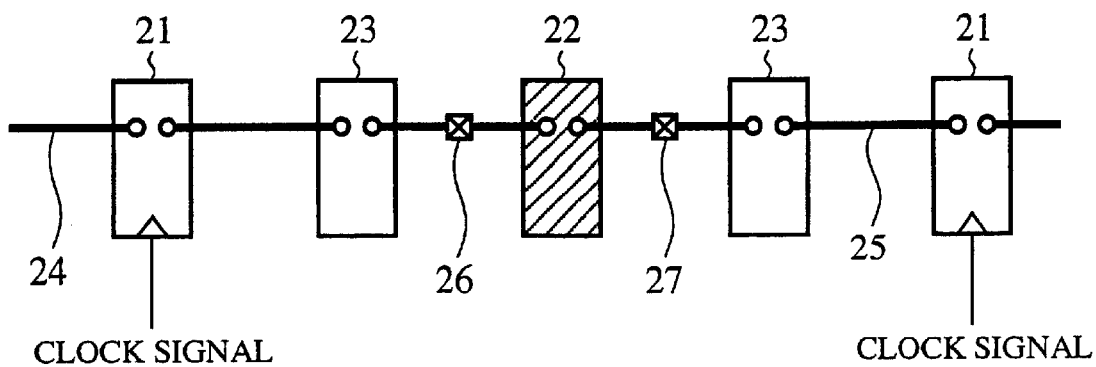
FIG. 2 shows a plurality of cells placed on a signal path according to the logical net list and dummy pins placed on both sides of the timing-free cell 22 according to the dummy pin information.

FIG. 2 shows a plurality of cells placed on a signal path according to the logical net list and dummy pins placed on both sides of the timing-free cell 22 according to the dummy pin information. In FIG. 2, 26 indicates a dummy pin placed on an upstream side of the timing-free cell 22, and 27 indicates a dummy pin placed on a downstream side of the timing-free cell 22. That is, the dummy pin 26 faces an input pin of the timing-free cell 22, and the dummy pin 27 faces an output pin of the timing-free cell 22. As shown in FIG. 2, when the correspondence of the dummy pin information to the logical net list is established in the step ST1, the dummy pins 26 and 27 are written in the logical net list to be placed at the boundaries between the timing-free cell 22 and the timing-considered cells 23 in the logical net list, and the logical net list indicates that the timing-free cell 22 is isolated from the timing-considered cells 21 and 23 and the nets through the dummy pins 26 and 27.

Thereafter, timing information indicating timing constraints for the timing-considered cells and the nets written in the logical net list is read out from a timing constraint file stored in the data base and is input to the layout performing data file to establish the correspondence of the timing information to the logical net list (step ST2). Therefore, the logical net list indicates that the timing information is allocated to each corresponding timing-considered cell. In the example shown in FIG. 2, the logical net list indicates that the timing information is allocated to each of the timing-considered cells 21 and 23.

Thereafter, in a step ST3, dummy pin layout-position information is read out from the data base and is input to the layout performing data file. The dummy pin layout-position information indicates positions of the dummy pins in a layout pattern of the timing-considered cells to be designed. In this case, the dummy pin layout-position information is prepared according to a place and route method. Also, it is applicable that the dummy pin layout-position information is prepared by a user. Therefore, in cases where the design of a layout pattern of timing-considered cells written in the logical net list is tried, a dummy pin is accurately placed at a boundary between the timing-free cell having no information and each timing-considered cell adjacent to the timing-free cell according to the dummy pin layout-position information. In the example shown in FIG. 2, the dummy pins 26 and 27 are placed at boundaries between the timing-free cell 22 and the timing-considered cells 23 to isolate the timing-free cell 22 from the timing-considered cells 21 and 23 and the nets. Thereafter, in the step ST3, a floor plan is performed according to the logical net list and the timing information, of which the correspondence is established in the step ST2, to roughly place the timing-considered cells and the timing-free cell in an area of the semiconductor integrated circuit.

Thereafter, in a step ST4, an automatic layout routing based on the timing driven layout technique is performed for the timing-considered cells of which the layout is roughly determined in the floor plan performed in the step ST3, and a layout pattern of the timing-considered cells connected with each other in the semiconductor integrated circuit is designed.

As is described above, in the first embodiment, the logical net list and the dummy pin information are prepared to place a dummy pin on a signal path between the timing-free cell specified by the user and each of timing-considered cells adjacent to the timing-free cell. Accordingly, even though the timing-free cell having no timing information is placed on the signal path with the timing-considered cells respectively having timing information, an area of all cells placed on the signal path is divided into a layout area of the timing-considered cells and an out-of-layout area of the timing-free cell, and the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 2

In the first embodiment, the dummy pin information is used to isolate the timing-free cell 22 from the timing-considered cells 21 and 23 through the dummy pins. However, in an automatic cell placement and routing method according to a second embodiment, a user specifies in advance a timing-free cell by inputting cell information of the timing-free cell, a dummy pin is placed at a boundary between the timing-free cell and each timing-considered cell adjacent to the timing-free cell, and the timing driven layout is performed for the timing-considered cells so as to design a layout pattern of the timing-considered cells to be arranged in a semiconductor integrated circuit.

Figure 3:
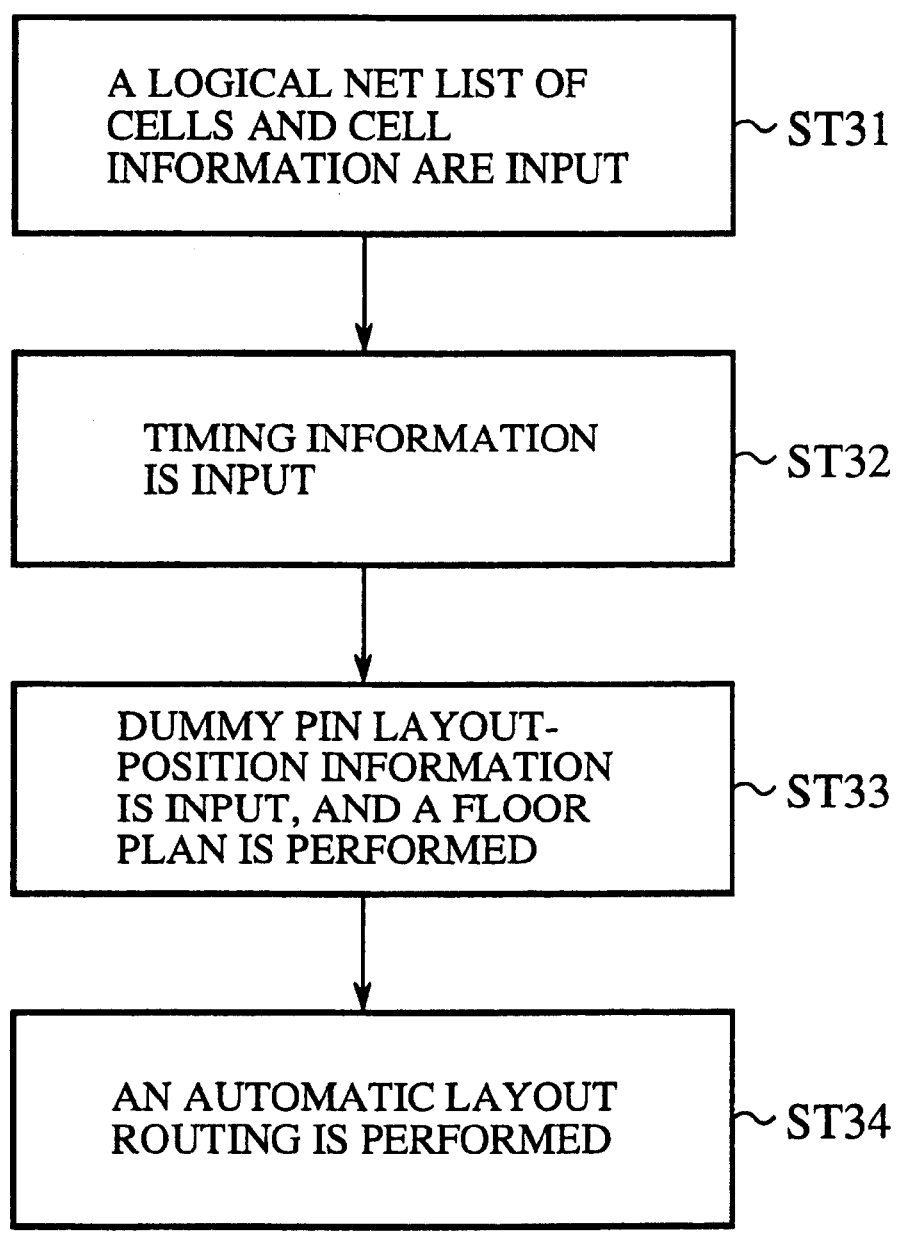
FIG. 3 is a flow chart showing an automatic cell placement and routing method according to a second embodiment of the present invention.

FIG. 3 is a flow chart showing an automatic cell placement and routing method according to a second embodiment of the present invention. The relationship between the group of cells written in a logical net list and the group of dummy pins is shown in FIG. 2.

An automatic cell placement and routing method is described in detail with reference to FIG. 3.

As shown in FIG. 3, in a step ST31, a logical net list, which is prepared according to specifications of the configuration and functions of a semiconductor integrated circuit described in a hardware description language (HDL), is read out from the data base and is input to a layout performing data file (not shown). The logical net list indicates information of a set of cells (composed of timing-considered cells and a timing-free cell) to be arranged in the semiconductor integrated circuit and information of a connection relationship among the cells connected with each other through nets.

Thereafter, in the step ST31, cell information of a timing-free cell, for which a user does not desire to design a layout pattern according to a timing driven layout, is read out from the data base. In the example shown in FIG. 2, the timing-free cell denotes the timing-free cell 22 placed between the timing-considered cells 23.

Pieces of cell information of a plurality of timing-free cells are stored in the data base, and each piece of cell information of a timing-free cell is, for example, composed of a master name of the timing-free cell, an instance name of the timing-free cell, information indicating a position of the timing-free cell in the logical net list and information indicating a block area of a plurality of timing-free cells including the corresponding timing-free cell. Here, the same master name (for example, inverter) is allocated to all timing-free cells having the same function as each other, and instance names differing from each other are allocated to all timing-free cells, to which the same master name is allocated, as identifiers. Therefore, even though a plurality of timing-free cells, to which the same master name is allocated, are written in the logical net list, one timing-free cell written in the logical net list can be identified according to the instance name allocated to the timing-free cell. It is applicable that the cell information is prepared by an user.

Thereafter, in the step ST31, the cell information of the timing-free cell is input to the layout performing data file so as to establish the correspondence of the cell information of the timing-free cell to the logical net list. Therefore, a dummy pin is written in the logical net list to be placed at a boundary between the timing-free cell and each timing-considered cell adjacent to the timing-free cell, and the logical net list indicates that the timing-free cell is isolated from the timing-considered cells and the nets through the dummy pins. In the example shown in FIG. 2, the dummy pins 26 and 27 are written in the logical net list to be placed at the boundaries between the timing-free cell 22 and the timing-considered cells 23 in the logical net list to isolate the timing-free cell 22 from the timing-considered cells 21 and 23 and the nets through the dummy pins 26 and 27.

Thereafter, timing information indicating timing constraints for the timing-considered cells and the nets written in the logical net list is read out from a timing constraint file stored in the data base and is input to the layout performing data file so as to establish the correspondence of the timing information to the logical net list (step ST32). Therefore, the logical net list indicates that timing information is allocated to each corresponding timing-considered cell. In the example shown in FIG. 2, the logical net list indicates that the timing information is allocated to each of the timing-considered cells 21, and 23.

Thereafter, in a step ST33, dummy pin layout-position information is read out from the data base and is input to the layout performing data file. The dummy pin layout-position information indicates positions of the dummy pins in a layout pattern of the timing-considered cells to be designed. In this case, the dummy pin layout-position information is prepared according to a place and route method. Also, it is applicable that the dummy pin layout-position information is prepared by a user. Therefore, in cases where the design of a layout pattern of the timing-considered cells written in the logical net list is tried, a dummy pin is accurately placed at a boundary between the timing-free cell having no information and each timing-considered cell adjacent to the timing-free cell according to the dummy pin layout-position information. In the example shown in FIG. 2, the dummy pins 26 and 27 are accurately placed at the boundaries between the timing-free cell 22 and the timing-considered cells 23. Thereafter, in the step ST33, a floor plan is performed according to the logical net list and the timing information, of which the correspondence is established in the step ST32, to roughly place the timing-considered cells and the timing-free cell in an area of the semiconductor integrated circuit.

Thereafter, in a step ST34, an automatic layout routing based on the timing driven layout technique is performed for the timing-considered cells of which the layout is roughly determined in the floor plan performed in the step ST33, and a layout pattern of the timing-considered cells connected with each other in the semiconductor integrated circuit is designed.

Accordingly, in the second embodiment, because the logical net list and the cell information of the timing-free cell, for which the user does not desire to design the design of a layout pattern, are prepared to place a dummy pin at the boundary between one timing-free cell and each of timing-considered cells adjacent to the timing-free cell, even though the timing-free cell is placed on the signal path on which the timing-considered cells are placed, an area of all cells placed on the signal path can be divided into a layout area of the timing-considered cells and an out-of-layout area of the timing-free cell. Therefore, the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 3

In the second embodiment, the user specifies in advance the timing-free cell having no timing information. However, in an automatic cell placement and routing method according to a third embodiment, a cell library is searched for cell information of each cell written in a logical net list, a specific cell is automatically recognized as a timing-free cell in cases where cell information of the specific cell is not registered in the cell library or cell information of the specific cell registered in the cell library is insufficient, a dummy pin is placed at a boundary between the timing-free cell and each timing-considered cell adjacent to the timing-free cell, and the timing driven layout is performed for the timing-considered cells and nets so as to design a layout pattern of the timing-considered cells to be arranged in a semiconductor integrated circuit.

Figure 4:
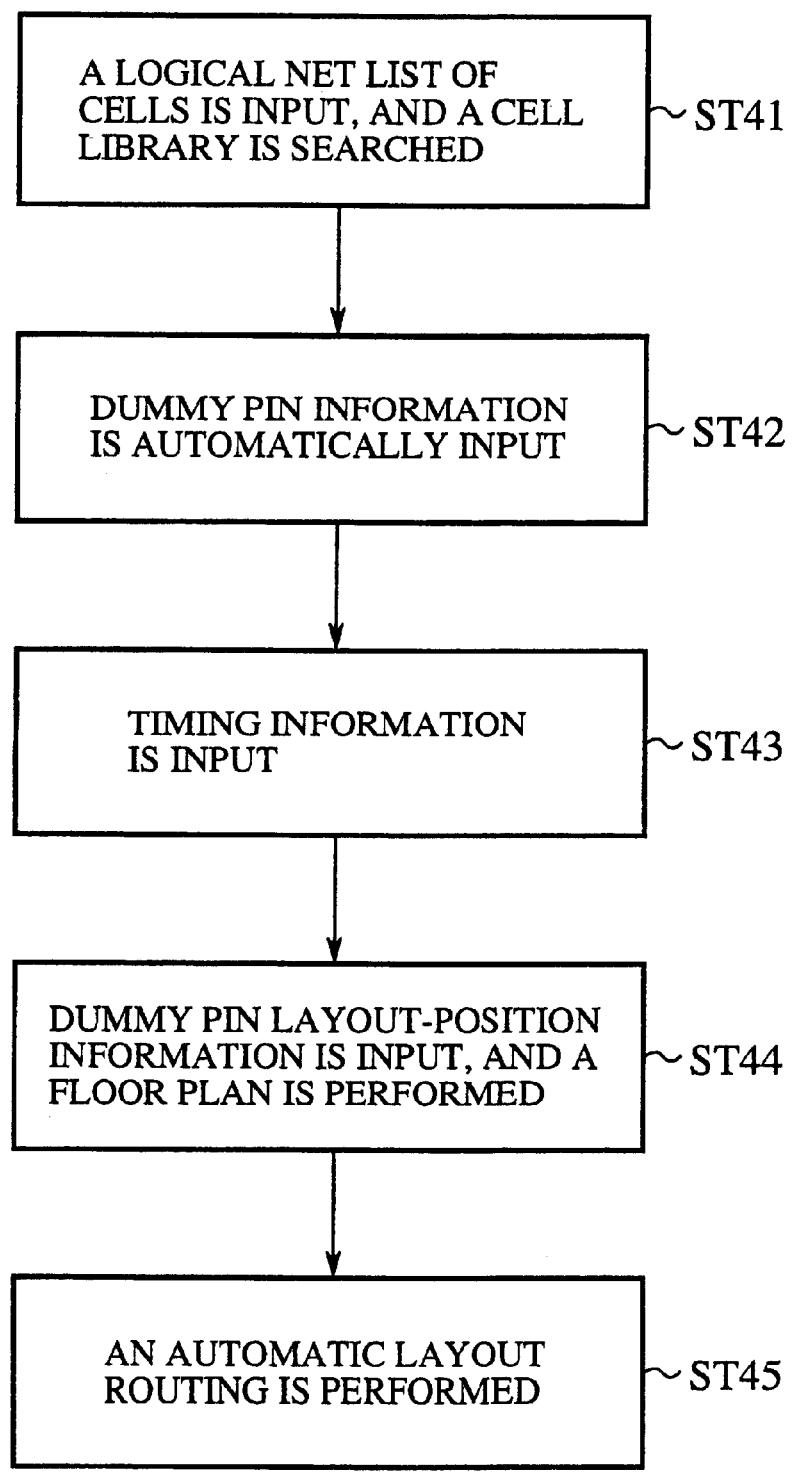
FIG. 4 is a flow chart showing an automatic cell placement and routing method according to a third embodiment of the present invention.

FIG. 4 is a flowchart showing an automatic cell placement and routing method according to a third embodiment of the present invention. The relationship between the group of cells written in a logical net list and the group of dummy pins is shown in FIG. 2.

An automatic cell placement and routing method is described in detail with reference to FIG. 4.

As shown in FIG. 4, in a step ST41, a logical net list, which is prepared according to specifications of the configuration and functions of a semiconductor integrated circuit described in a hardware description language (HDL), is read out from the data base and is input to a layout performing data file (not shown). The logical net list indicates information of a set of cells (composed of timing-considered cells and a timing-free cell) to be arranged in the semiconductor integrated circuit and information of a connection relationship among the cells connected with each other through nets.

Thereafter, in the step ST41, a cell library is searched for cell information of each cell written in the logical net list. In cases where cell information of a specific cell is not registered in the cell library or in cases where cell information of the specific cell registered in the cell library is insufficient, because no timing information of the specific cell is obtained from the cell library, the specific cell is automatically recognized as a timing-free cell for which the user does not desire to design a layout pattern. In the example shown in FIG. 2, the timing-free cell 22 denoting the specific cell is automatically specified.

Thereafter, dummy pin information of the timing-free cell is automatically read out from the data base. The dummy pin information is composed of dummy pin position information and information indicating the number of dummy pins. The dummy pin position information indicates a relative position of the timing-free cell connected with timing-considered cells through nets in the logical net list. Also, the dummy pin position information indicates that the timing-free cell is to be isolated from the timing-considered cells written in the logical net list by placing a dummy pin at a boundary between the timing-free cell and each timing-considered cell adjacent to the timing-free cell (step ST42).

Thereafter, the dummy pin information is input to the layout performing data file so as to establish the correspondence of the dummy pin information to the logical net list (step ST42). Therefore, a dummy pin is written in the logical net list to be placed at a boundary between the timing-free cell and each timing-considered cell adjacent to the timing-free cell, and the logical net list indicates that the timing-considered cells and nets, through which the timing-considered cells are connected with each other, are isolated from the timing-free cell through the dummy pins. Here, a layout pattern of the timing-considered cells and the nets is expected to be designed according to a timing driven layout, and a layout pattern of the timing-free cell is not expected to be designed. In the example shown in FIG. 2, the dummy pins 26 and 27 are written in the logical net list to be placed at the boundaries between the timing-free cell 22 and the timing-considered cells 23 adjacent to the timing-free cell 22, and the logical net list indicates that the timing-considered cells 21 and 23 and the nets are isolated from the timing-free cell 22 through the dummy pins 26 and 27.

Thereafter, timing information indicating timing constraints for the timing-considered cells and nets written in the logical net list is read out from a timing constraint file stored in the data base and is input to the layout performing data file, and the correspondence of the timing information to the logical net list is established in the layout performing data file (step ST43) Therefore, the logical net list indicates that timing information is allocated to each corresponding timing-considered cell. In the example shown in FIG. 2, the logical net list indicates that the timing information is allocated to each of the timing-considered cells 21 and 23.

Thereafter, in a step ST44, dummy pin layout-position information is read out from the data base and is input to the layout performing data file. The dummy pin layout-position information indicates positions of dummy pins in a layout pattern of the timing-considered cells to be designed. In this case, the dummy pin layout-position information is prepared according to a place and route method. Also, it is applicable that the dummy pin layout-position information is prepared by a user. Therefore, in cases where the design of a layout pattern of timing-considered cells written in the logical net list is tried, a dummy pin is accurately placed at a boundary between the timing-free cell having no information and each timing-considered cell adjacent to the timing-free cell according to the dummy pin layout-position information. In the example shown in FIG. 2, the dummy pins 26 and 27 are accurately placed at the boundaries between the timing-free cell 22 and the timing-considered cells 23 according to the dummy pin layout-position information to isolate the timing-free cell 22 from the timing-considered cells 21 and 23 and the nets through the dummy pins 26 and 27. Thereafter, in the step ST44, a floor plan is performed according to the logical net list and the timing information, of which the correspondence is established in the step ST43, to roughly place the timing-considered cells and the timing-free cell in an area of the semiconductor integrated circuit.

Thereafter, in a step ST45, an automatic layout routing based on the timing driven layout technique is performed for the timing-considered cells of which the layout is roughly determined in the floor plan performed in the step ST44, and a layout pattern of the timing-considered cells connected with each other in the semiconductor integrated circuit is designed.

As is described above, in the third embodiment, the logical net list are prepared, a specific cell is automatically recognized as the timing-free cell, for which the user does not desire to design a layout, in cases where cell information of the specific cell is not registered in the cell library or in cases where cell information of the specific cell registered in the cell library is insufficient, and a dummy pin is placed at the boundary between the timing-free cell and each of the timing-considered cells adjacent to the timing-free cell. Accordingly, even though the timing-free cell having no timing information is placed on the signal path on which the timing-considered cells respectively having timing information are placed, an area of all cells placed on the signal path can be divided into a layout area of the timing-considered cells and an out-of-layout area of the timing-free cell, and the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 4

In an automatic cell placement and routing method according to a fourth embodiment, a cell library is searched for cell information of each cell written in a logical net list, a specific cell is automatically recognized as a timing-free cell in cases where cell information of the specific cell is not registered in the cell library or cell in cases where cell information of the specific cell registered in the cell library is insufficient, start point information indicating a start point of a timing check or end point information indicating an end point of a timing check is placed as a dummy pin at a boundary between the timing-free cell and each timing-considered cell adjacent to the timing-free cell, and a timing driven layout is performed for the timing-considered cells and nets so as to design a layout pattern of the timing-considered cells to be arranged in a semiconductor integrated circuit.

Figure 5:
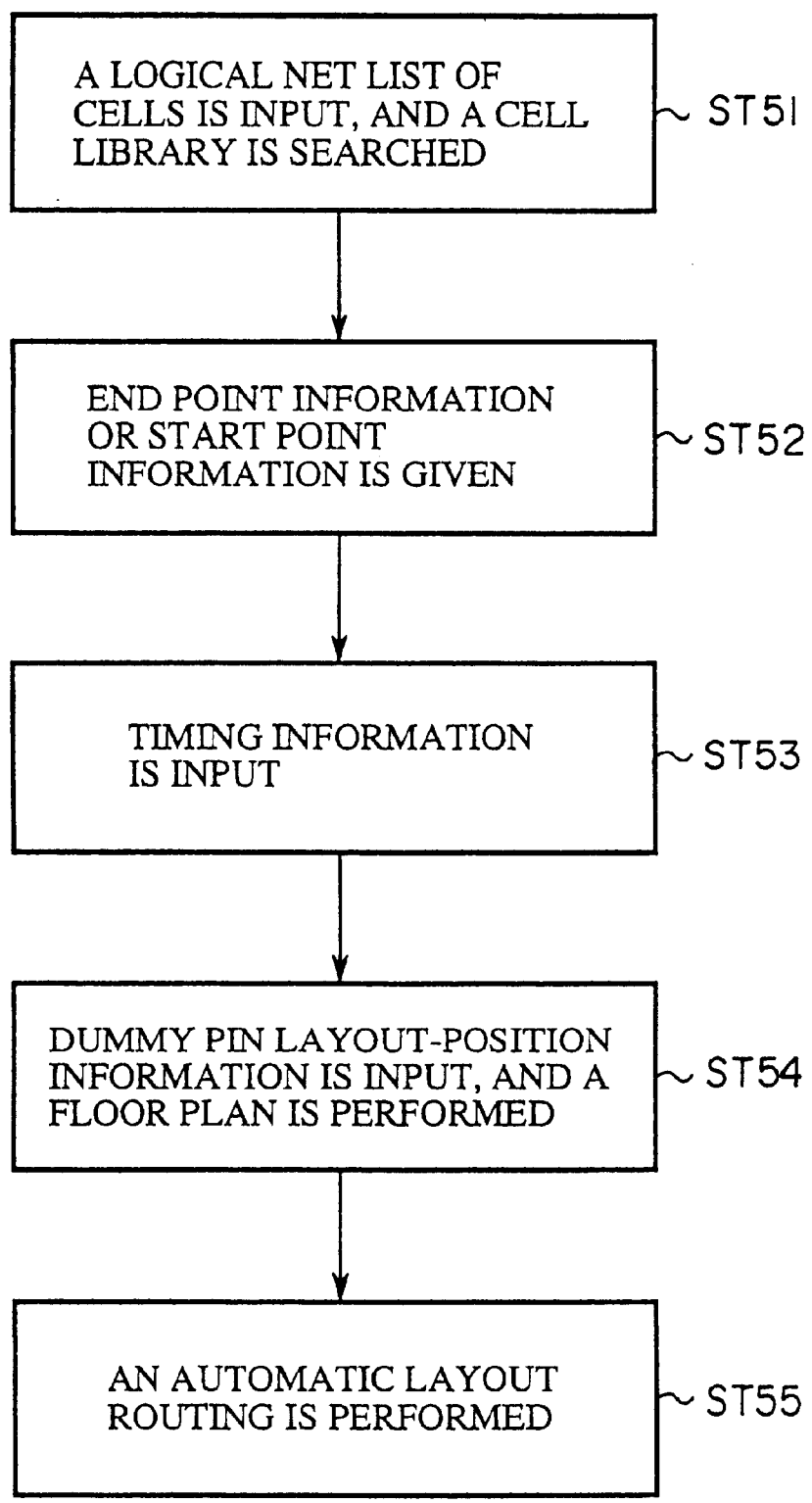
FIG. 5 is a flowchart showing an automatic cell placement and routing method according to a fourth embodiment of the present invention.

FIG. 5 is a flowchart showing an automatic cell placement and routing method according to a fourth embodiment of the present invention. The relationship between the group of cells written in a logical net list and the group of dummy pins is shown in FIG. 2.

An automatic cell placement and routing method is described in detail with reference to FIG. 5.

As shown in FIG. 5, in a step ST51, a logical net list, which is prepared according to specifications of the configuration and functions of a semiconductor integrated circuit described in a hardware description language (HDL), is read out from the data base and is input to a layout performing data file (not shown). The logical net list indicates information of a set of cells (composed of timing-considered cells and a timing-free cell) to be arranged in the semiconductor integrated circuit and information of a connection relationship among the cells connected with each other through nets.

Thereafter, in the step ST51, a cell library is searched for cell information of each cell written in the logical net list. In cases where cell information of a specific cell is not registered in the cell library or in cases where cell information of the specific cell registered in the cell library is insufficient, because no timing information of the specific cell is obtained from the cell library, the specific cell is automatically recognized as a timing-free cell for which the user does not desire to design a layout pattern. In the example shown in FIG. 2, the timing-free cell 22 denoting the specific cell is automatically specified.

In this embodiment, in cases where a boundary between the timing-free cell and the timing-considered cell adjacent to the timing-free cell is placed on an input pin side of the timing-free cell or in cases where a timing-considered cell (in the example shown in FIG. 2, the timing-considered cell 23 placed on the upstream side of the timing-free cell 22), which drives a net connected with an input pin of a timing-free cell, is written in the logical net list, the boundary is called a timing check end boundary. Also, in cases where a boundary between the timing-free cell and the timing-considered cell adjacent to the timing-free cell is placed on an output pin side of the timing-free cell or in cases where a timing-considered cell (in the example shown in FIG. 2, the timing-considered cell 23 placed on the downstream side of the timing-free cell 22), which drives a net connected with an output pin of the timing-free cell, is written in the logical net list, the boundary is called a timing check start boundary.

Thereafter, the correspondence of end point information indicating an end point of a timing check to the logical net list is established to placed the end point information as a dummy pin at the timing check end boundary, and the correspondence of start point information indicating a start point of a timing check to the logical net list is established to placed the start point information as a dummy pin at the timing check start boundary (step ST52). In the example shown in FIG. 2, the end point information is placed at a boundary between the timing-free cell 22 and the timing-considered cell 23 placed on the left side (or the upstream side) of the timing-free cell 22, and the start point information is placed at a boundary between the timing-free cell 22 and the timing-considered cell 23 placed on the right side (or the downstream side) of the timing-free cell 22.

Thereafter, timing information indicating timing constraints for the timing-considered cells and nets written in the logical net list is read out from a timing constraint file stored in the data base and is input to the layout performing data file, and the correspondence of the timing information to the logical net list is established in the layout performing data file (step ST53). Therefore, the logical net list indicates that timing information is allocated to each corresponding timing-considered cell. In the example shown in FIG. 2, the logical net list indicates that the timing information is allocated to each of the timing-considered cells 21 and 23.

Thereafter, dummy pin layout-position information is read out from the data base and is input to the layout performing data file(step ST54). The dummy pin layout-position information indicates positions of the dummy pins (that is, the end point information and the start point information) in a layout pattern of the timing-considered cells to be designed. In this case, the dummy pin layout-position information is prepared according to a place and route method. Also, it is applicable that the dummy pin layout-position information be prepared by a user. Therefore, in cases where the design of a layout pattern of timing-considered cells written in the logical net list is tried, the end point information and the start point information are placed at boundaries between the timing-free cell and the timing-considered cells adjacent to the timing-free cell in the layout pattern to indicate that a timing checking operation is required for the timing-considered cells which are placed in a layout area extending from the input terminal to the position of the end point information and are placed in a layout area extending from the position of the start point information to the output terminal, and a layout pattern of the timing-considered cells isolated from the timing-free cell can be designed. In the example shown in FIG. 2, the end point information is accurately placed as the dummy pin 26 on the left side of the timing-free cell 22 in the layout pattern according to the dummy pin layout-position information, the start point information is accurately placed as the dummy pin 27 on the right side of the timing-free cell 22 in the layout pattern according to the dummy pin layout-position information.

Thereafter, in the step ST54, a floor plan is performed according to the logical net list and the timing information, of which the correspondence is established in the step ST53, to roughly place the timing-considered cells and the timing-free cell.

Thereafter, in a step ST55, an automatic layout routing based on the timing driven layout technique is performed for the result of the floor plan obtained in the step ST53, and a layout pattern of the timing-considered cells 21 and 23 written in the logical net list is designed.

As is described above, in the fourth embodiment, the logical net list is prepared, a specific cell is automatically recognized as the timing-free cell, for which the user does not desire to design a layout, in cases where cell information of the specific cell is not registered in the cell library or in cases where cell information of the specific cell registered in the cell library is insufficient, the end point information indicating an end point of a timing check is placed at the timing check end boundary, and the start point information indicating a start point of a timing check is placed at the timing check start boundary. Accordingly, even though the timing-free cell having no timing information is placed on the signal path on which the timing-considered cells respectively having timing information are placed, an area of all cells placed on the signal path can be divided into a layout area of the timing-considered cells and an out-of-layout area of the timing-free cell, and the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 5

In a fifth embodiment, the determination of positions of the dummy pins performed in the step ST3 of the first embodiment, the step ST33 of the second embodiment or the step ST44 of the third embodiment is described. In particular, a user determines positions of the dummy pins in the layout pattern of the cells and nets.

Figure 6:
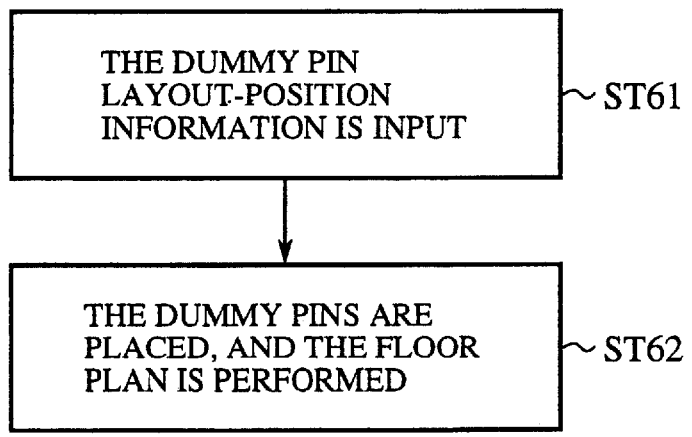
FIG. 6 is a flow chart showing the determination of positions of the dummy pins performed in a step ST3 of the first embodiment, a step ST33 of the second embodiment or a step ST44 of the third embodiment according to a fifth embodiment of the present invention.

FIG. 6 is a flow chart showing the determination of positions of the dummy pins performed in the step ST3 of the first embodiment, the step ST33 of the second embodiment or the step ST44 of the third embodiment according to a fifth embodiment of the present invention. The relationship between the group of cells written in a logical net list and the group of dummy pins is shown in FIG. 2.

An automatic cell placement and routing method is described in detail with reference to FIG. 6.

The steps ST1 and ST2 of the first embodiment, the steps ST31 and ST32 of the second embodiment or the steps ST41, ST42 and ST43 of the third embodiment are performed. Thereafter, as shown in FIG. 6, dummy pin layout-position information specified by a user is input to the layout performing data file(step ST61). The dummy pin layout-position information is specified by the user according to one of four cases. In a first case, the dummy pin layout-position information indicates an absolute position of each dummy pin which is placed in a layout pattern of cells to be arranged in the semiconductor integrated circuit. In a second case, the dummy pin layout-position information indicates relative positions of the dummy pins which is placed in a layout pattern of cells to be arranged in the semiconductor integrated circuit. In a third case, the dummy pin layout-position information indicates absolute positions of a part of dummy pins or relative positions of a part of dummy pins. A fourth case denotes the combination of the first, second and third cases.

Thereafter, the dummy pins are placed in the layout pattern of the cells and nets according to the dummy pin layout-position information, a layout area of the timing-considered cells is determined, and a floor plan is performed according to the timing information (step ST62). Thereafter, the step ST4 of the first embodiment, the step ST34 of the second embodiment or the step ST45 of the third embodiment is performed.

As is described above, in the fifth embodiment, the dummy pin layout-position information indicating the positions of the dummy pins in the layout pattern of the cells is specified by the user, and the floor plan is performed according to the timing information. Accordingly, the position of each dummy pin can be determined in cases where the user needs the dummy pin, and the layout pattern of the timing-considered cells placed in the layout area can be designed according to the automatic cell placement and routing method based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 6

In a sixth embodiment, the determination of positions of the dummy pins performed in the step ST3 of the first embodiment, the step ST33 of the second embodiment or the step ST44 of the third embodiment is described. In particular, and a layout area of the timing-considered cells and an out-of-layout area of the timing-free cell set in the steps ST1, ST31 or ST41 are distinguished from each other according to names which are allocated to the dummy pins as the dummy pin layout-position information.

Figure 7:
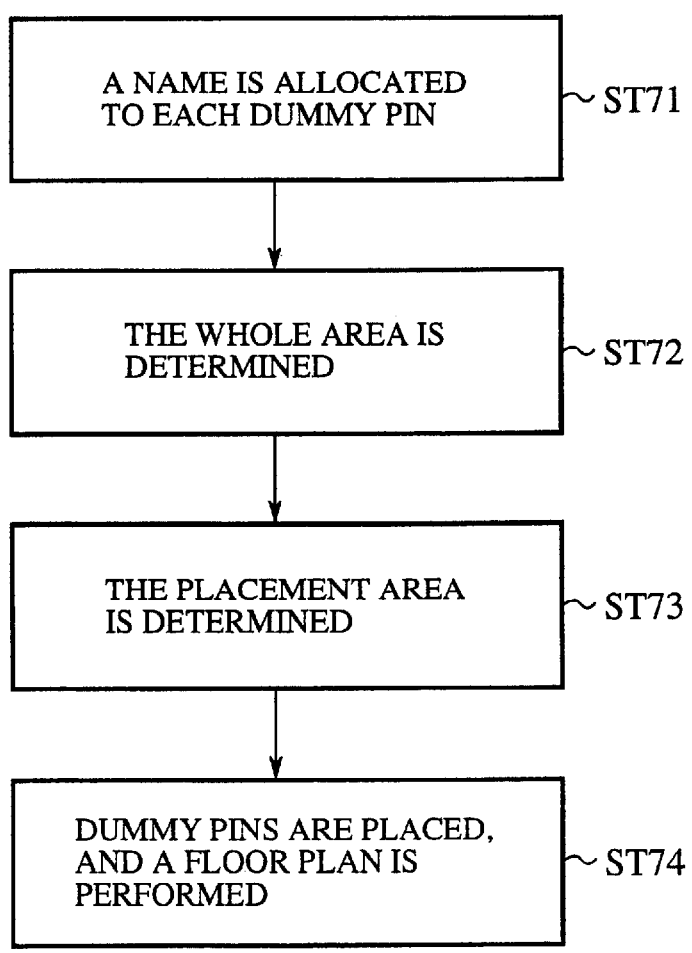
FIG. 7 is a flow chart showing the determination of positions of the dummy pins performed in a step ST3 of the first embodiment, a step ST33 of the second embodiment or a step ST44 of the third embodiment according to a sixth embodiment of the present invention.

FIG. 7 is a flow chart showing the determination of positions of the dummy pins performed in the step ST3 of the first embodiment, the step ST33 of the second embodiment or the step ST44 of the third embodiment according to a sixth embodiment of the present invention. The relationship between the group of cells written in a logical net list and the group of dummy pins is shown in FIG. 2.

An automatic cell placement and routing method is described in detail with reference to FIG. 7.

The steps ST1 and ST2 of the first embodiment, the steps ST31 and ST32 of the second embodiment or the steps ST41, ST42 and ST43 of the third embodiment are performed. In cases where a plurality of timing-free cells exists in the cells written in the logical net list, a plurality of layout areas and a plurality of out-of-layout areas are set in the steps ST1, ST31 or ST41.

Thereafter, a name is allocated to each dummy pin, and a layout area of the timing-considered cells and an out-of-layout area of the timing-free cell set in the steps ST1, ST31 or ST41 are distinguished from each other according to names of the dummy pins (Step ST71).

Thereafter, the whole area composed of the layout area of the timing-considered cells and the out-of-layout area of the timing-free cell is determined as an area in which the layout pattern of the cells and nets are designed (step ST72).

Thereafter, the placement of the timing-considered cells and the timing-free cell to be arranged in the semiconductor integrated circuit is determined according to sizes of the layout area and the out-of-layout area (step ST73).

Thereafter, the dummy pins are placed at boundaries between the layout area and the out-of-layout area, and a floor plan is performed according to the timing information (step ST74).

Thereafter, an automatic layout routing based on the timing driven layout technique is performed for the result of the floor plan obtained in the step ST74 in the same manner as the step ST4 of the first embodiment, the step ST34 of the second embodiment or the step ST45 of the third embodiment, and a layout pattern of the timing-considered cells written in the logical net list is designed.

As is described above, in the sixth embodiment, a name is allocated to each dummy pin, a layout area of the timing-considered cells and an out-of-layout area of the timing-free cell are distinguished from each other according to the names allocated to the dummy pins, and the floor plan is performed according to the timing information. Accordingly, the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 7

In a seventh embodiment, an automatic layout routing based on the timing driven layout technique, which is performed in the step ST4 of the first embodiment, the step ST34 of the second embodiment, the step ST45 of the third embodiment or the step ST55 of the fourth embodiment, is described in detail.

Figure 8:
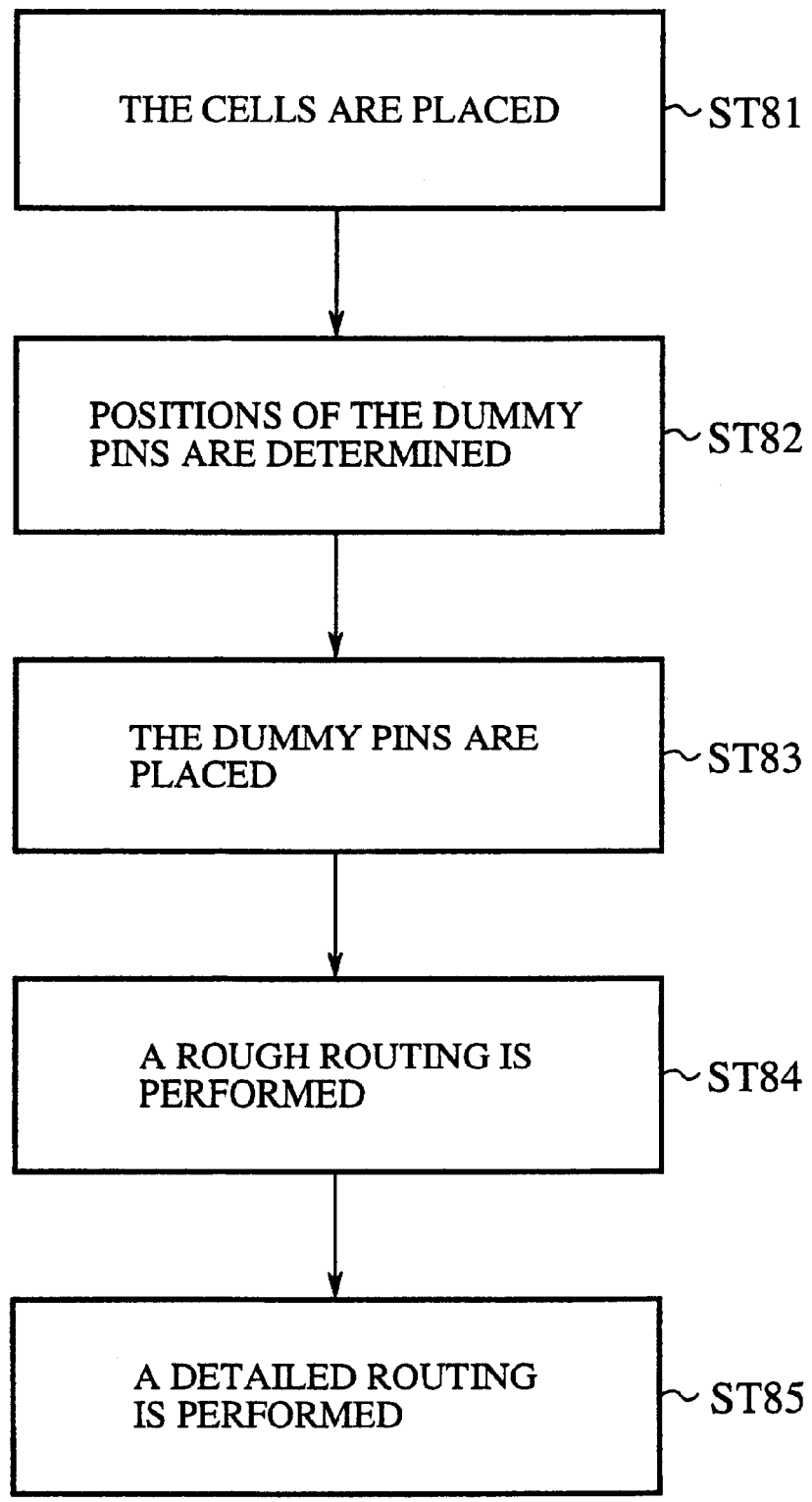
FIG. 8 is a flow chart showing an automatic layout routing based on the timing driven layout technique, which is performed in a step ST4 of the first embodiment, a step ST34 of the second embodiment, the step ST45 of a third embodiment or a step ST55 of the fourth embodiment, according to a seventh embodiment of the present invention.

FIG. 8 is a flow chart showing an automatic layout routing based on the timing driven layout technique, which is performed in the step ST4 of the first embodiment, the step ST34 of the second embodiment, the step ST45 of the third embodiment or the step ST55 of the fourth embodiment, according to a seventh embodiment of the present invention. The relationship between the group of cells written in a logical net list and the group of dummy pins is shown in FIG. 2.

An automatic cell placement and routing method is described in detail with reference to FIG. 8.

After the steps ST1 to ST3 of the first embodiment, the steps ST31 to ST33 of the second embodiment or the steps ST41 to ST44 of the third embodiment or the steps ST51 to ST55 of the fourth embodiment are performed, the cells written in the logical net list are placed according to the floor plan (step ST81). Thereafter, positions of the dummy pins to be placed in the layout pattern of the cells are determined according to the dummy pin layout-position information and the relative positions of the cells placed in the logical net list (step ST82).

After the positions of the dummy pins are determined, the dummy pins are placed in the layout pattern of the cells (step ST83). Thereafter, a layout area of the timing-considered cells is specified according to the dummy pins placed in the layout pattern of the cells, and a rough routing for the timing-considered cells of the layout area is performed (step ST84). In this rough routing, wiring routes of signal wires are determined in the layout pattern of the timing-considered cells, and the maximum number of signal wires possible to be arranged in a wiring area (for example, 5 tracks×5 tracks) is estimated.

After the rough routing is completed, a detailed routing for the timing-considered cells of the layout area is performed (step ST85). In this detailed routing, all signal wires connecting the timing-considered cells with each other through the wiring routes are placed in the layout area of the timing-considered cells on condition that the number of signal wires in the wiring area is equal to or lower than the maximum number of signal wires. Therefore, the automatic layout routing is completed.

As is described above, in the seventh embodiment, the cells are placed, the positions of the dummy pins are determined, the dummy pins are placed, the rough routing is performed, and the detailed routing is performed. Accordingly, the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 8

In an eighth embodiment, another automatic layout routing based on the timing driven layout technique, which is performed in the step ST4 of the first embodiment, the step ST34 of the second embodiment, the step ST45 of the third embodiment or the step ST55 of the fourth embodiment, is described in detail.

Figure 9:
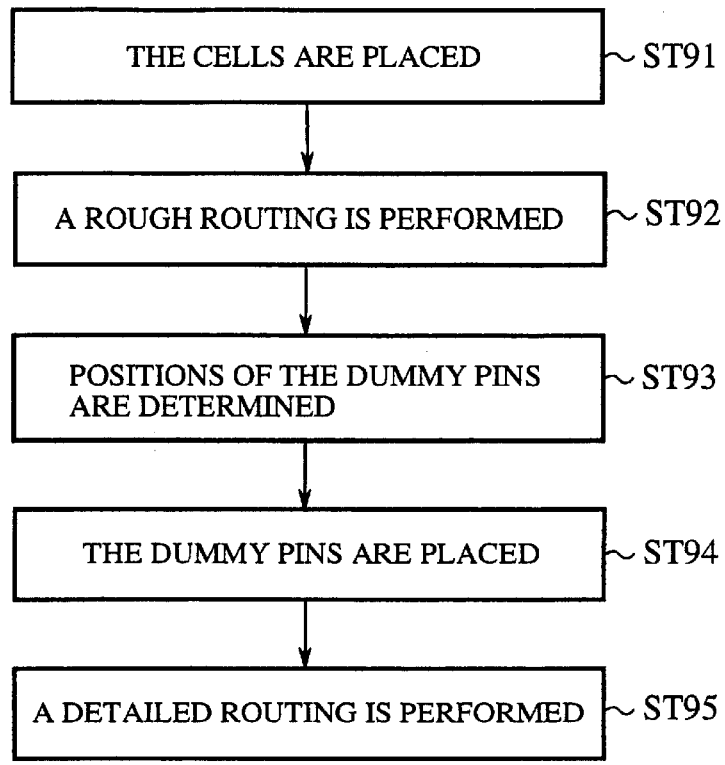
FIG. 9 is a flow chart showing an automatic layout routing based on the timing driven layout technique, which is performed in a step ST4 of the first embodiment, a step ST34 of the second embodiment, a step ST45 of the third embodiment or a step ST55 of the fourth embodiment, according to an eighth embodiment of the present invention.

FIG. 9 is a flow chart showing an automatic layout routing based on the timing driven layout technique, which is performed in the step ST4 of the first embodiment, the step ST34 of the second embodiment, the step ST45 of the third embodiment or the step ST55 of the fourth embodiment, according to an eighth embodiment of the present invention. The relationship between the group of cells written in a logical net list and the group of dummy pins is shown in FIG. 2.

An automatic cell placement and routing method is described in detail with reference to FIG. 9.

After the steps ST1 to ST3 of the first embodiment, the steps ST31 to ST33 of the second embodiment or the steps ST41 to ST44 of the third embodiment or the steps ST51 to ST55 of the fourth embodiment are performed, the cells written in the logical net list are placed according to the floor plan (step ST91). Thereafter, a rough routing for the timing-considered cells of the layout area is performed (step ST92). This rough routing is performed in the same manner as in the seventh embodiment.

Thereafter, positions of the dummy pins to be placed in the layout pattern of the cells are determined according to the dummy pin layout-position information and the relative positions of the cells in the logical net list (step ST93).

After the positions of the dummy pins are determined, the dummy pins are placed in the layout pattern of the cells (step ST94). Thereafter, the layout area of the timing-considered cells is specified according to the dummy pins placed in the layout pattern of the cells, and a detailed routing for the timing-considered cells of the layout area is performed (step ST95). This detailed routing is performed in the same manner as in the seventh embodiment.

As is described above, in the eighth embodiment, the cells are placed, the rough routing is performed, the positions of the dummy pins are determined, the dummy pins are placed, and the detailed routing is performed. Accordingly, the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 9

In a ninth embodiment, another automatic layout routing based on the timing driven layout technique, which is performed in the step ST4 of the first embodiment, the step ST34 of the second embodiment, the step ST45 of the third embodiment or the step ST55 of the fourth embodiment, is described in detail.

Figure 10:
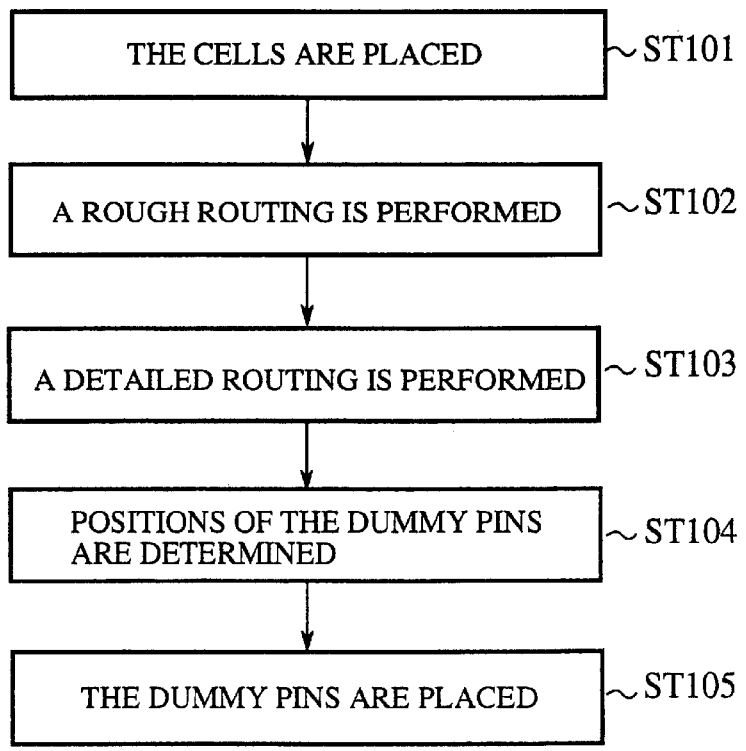
FIG. 10 is a flow chart showing an automatic layout routing based on the timing driven layout technique, which is performed in a step ST4 of the first embodiment, a step ST34 of the second embodiment, a step ST45 of the third embodiment or a step ST55 of the fourth embodiment, according to a ninth embodiment of the present invention.

FIG. 10 is a flow chart showing an automatic layout routing based on the timing driven layout technique, which is performed in the step ST4 of the first embodiment, the step ST34 of the second embodiment, the step ST45 of the third embodiment or the step ST55 of the fourth embodiment, according to a ninth embodiment of the present invention. The relationship between the group of cells written in a logical net list and the group of dummy pins is shown in FIG. 2.

An automatic cell placement and routing method is described in detail with reference to FIG. 10.

After the steps ST1 to ST3 of the first embodiment, the steps ST31 to ST33 of the second embodiment or the steps ST41 to ST44 of the third embodiment or the steps ST51 to ST55 of the fourth embodiment are performed, the cells written in the logical net list are placed according to the floor plan (step ST101). Thereafter, a rough routing for the timing-considered cells of the layout area is performed (step ST102). This rough routing is performed in the same manner as in the seventh embodiment.

Thereafter, a detailed routing for the timing-considered cells of the layout area is performed (step ST103). This detailed routing is performed in the same manner as in the seventh embodiment.

Thereafter, positions of the dummy pins to be placed in the layout pattern of the cells are determined according to the dummy pin layout-position information and the relative positions of the cells in the logical net list (step ST104).

After the positions of the dummy pins are determined, the dummy pins are placed in the layout pattern of the cells (step ST105).

As is described above, in the ninth embodiment, the cells are placed, the rough routing is performed, the detailed routing is performed, the positions of the dummy pins are determined, and the dummy pins are placed. Accordingly, the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

Embodiment 10

In a tenth embodiment, another automatic layout routing based on the timing driven layout technique, which is performed in the step ST4 of the first embodiment, the step ST34 of the second embodiment, the step ST45 of the third embodiment or the step ST55 of the fourth embodiment, is described in detail.

Figure 11:
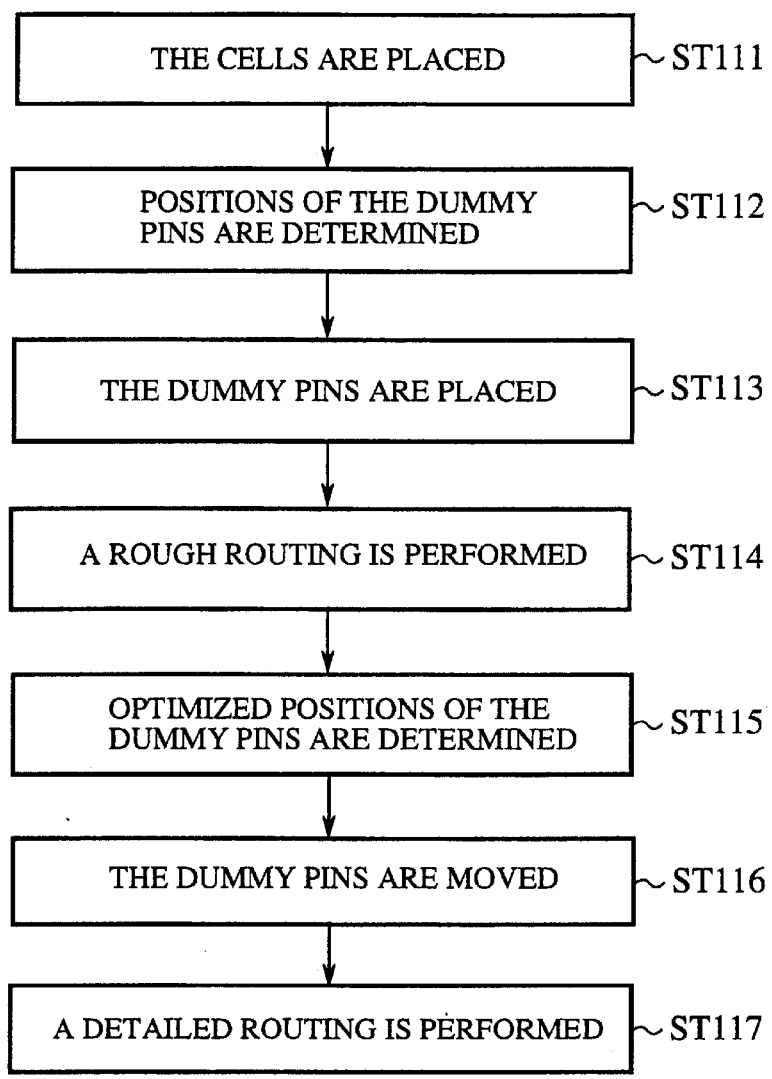
FIG. 11 is a flow chart showing an automatic layout routing based on the timing driven layout technique, which is performed in a step ST4 of the first embodiment, a step ST34 of the second embodiment, a step ST45 of the third embodiment or a step ST55 of the fourth embodiment, according to a tenth embodiment of the present invention.

FIG. 11 is a flow chart showing an automatic layout routing based on the timing driven layout technique, which is performed in the step ST4 of the first embodiment, the step ST34 of the second embodiment, the step ST45 of the third embodiment or the step ST55 of the fourth embodiment, according to a tenth embodiment of the present invention. The relationship between the group of cells written in a logical net list and the group of dummy pins is shown in FIG. 2.

An automatic cell placement and routing method is described in detail with reference to FIG. 11.

After the steps ST1 to ST3 of the first embodiment, the steps ST31 to ST33 of the second embodiment or the steps ST41 to ST44 of the third embodiment or the steps ST51 to ST55 of the fourth embodiment are performed, the cells written in the logical net list are placed according to the floor plan (step ST111).

Thereafter, positions of the dummy pins to be placed in the layout pattern of the cells are determined according to the dummy pin layout-position information and the relative positions of the cells in the logical net list (step ST112).

After the positions of the dummy pins are determined, the dummy pins are placed in the layout pattern of the cells (step ST113). Thereafter, the layout area of the timing-considered cells is specified according to the dummy pins placed in the layout pattern of the cells, and a rough routing for the timing-considered cells of the layout area is performed (step ST114). This rough routing is performed in the same manner as in the seventh embodiment.

Thereafter, optimized positions of the dummy pins are determined (step ST115), the dummy pins are moved to the optimized positions of the dummy pins (step ST116). Thereafter, a detailed routing for the timing-considered cells of the layout area is performed to place all signal wires connecting the timing-considered cells with each other through the routing routes in the layout area of the timing-considered cells on condition that the number of signal wires in the wiring area is equal to or lower than the maximum number of signal wires (step ST117).

As is described above, in the tenth embodiment, the cells are placed, the positions of the dummy pins are determined, the dummy pins are placed, the rough routing is performed, and the detailed routing is performed. Accordingly, the timing-considered cells can be automatically placed in the design of a layout pattern of the timing-considered cells according to the automatic layout routing based on the timing driven layout technique. That is, a design time required for the design of the layout pattern of the timing-considered cells to be arranged in the semiconductor integrated circuit can be shortened, and a design efficiency for the design of the layout pattern of the timing-considered cells can be improved.

What is claimed is:

1. An automatic cell placement and routing method, comprising the steps of:

preparing a logical net list of a timing-free cell, a plurality of timing-considered cells and nets, through which the timing-free cell and the timing-considered cells are connected with each other, to be arranged in a semiconductor integrated circuit;

preparing dummy pin information to specify the timing-free cell written in the logical net list and to isolate the timing-free cell from the timing-considered cells and the nets by placing dummy pins on both sides of the timing-free cell;

preparing timing information indicating timing constraints of the timing-considered cells and the nets through which the timing-considered cells are connected with each other; and performing an automatic layout routing for the timing-considered cells according to the logical net list, the dummy pin information and the timing information to design a layout pattern of the timing-considered cells in the semiconductor integrated circuit.

2. An automatic cell placement and routing method, comprising the steps of:

preparing a logical net list of a timing-free cell, a plurality of timing-considered cells and nets, through which the timing-free cell and the timing-considered cells are connected with each other, to be arranged in a semiconductor integrated circuit;

preparing dummy pin information to specify the timing-free cell written in the logical net list;

establishing the correspondence of the dummy pin information to the logical net list to place a dummy pin at a boundary between the timing-free cell and each timing-considered cell adjacent to the timing-free cell;

preparing timing information indicating timing constraints of the timing-considered cells and the nets through which the timing-considered cells are connected with each other;

establishing the correspondence of the timing information to the logical net list to allocate the timing information to the timing-considered cells written in the logical net list;

preparing dummy pin layout-position information indicating positions of the dummy pins in a layout pattern of the timing-considered cells;

performing a floor plan for the timing-considered cells according to the logical net list, the timing information and the dummy pin layout-position information; and performing an automatic layout routing for a result of the floor plan to design a layout pattern of the timing-considered cells in the semiconductor integrated circuit.

3. An automatic cell placement and routing method, comprising the steps of:

preparing a logical net list of a timing-free cell, a plurality of timing-considered cells and nets, through which the timing-free cell and the timing-considered cells are connected with each other, to be arranged in a semiconductor integrated circuit;

preparing cell information of the timing-free cell for which the design of a layout pattern is not desired;

establishing the correspondence of the cell information to the logical net list to place a dummy pin at a boundary between the timing-free cell and each timing-considered cell adjacent to the timing-free cell;

preparing timing information indicating timing constraints of the timing-considered cells and the nets through which the timing-considered cells are connected with each other;

establishing the correspondence of the timing information to the logical net list to allocate the timing information to the timing-considered cells written in the logical net list;

preparing dummy pin layout-position information indicating positions of the dummy pins in a layout pattern of the timing-considered cells;

performing a floor plan for the timing-considered cells according to the logical net list, the timing information and the dummy pin layout-position information; and performing an automatic layout routing for a result of the floor plan to design a layout pattern of the timing-considered cells in the semiconductor integrated circuit.

4. An automatic cell placement and routing method, comprising the steps of:

preparing a logical net list of cells and nets, through which the cells are connected with each other, to be arranged in a semiconductor integrated circuit;

searching a cell library for cell information of each cell written in the logical net list;

automatically setting a specific cell, of which the cell information is not registered in the cell library or of which the cell information is insufficient in the cell library, as a timing-free cell for which the design of a layout pattern is not desired, the cells of the logical net list other than the specific cell being called timing-considered cells;

establishing the correspondence of a dummy pin to the logical net list to place the dummy pin at a boundary between the timing-free cell and each timing-considered cell adjacent to the timing-free cell;

preparing timing information indicating timing constraints of the timing-considered cells and the nets through which the timing-considered cells are connected with each other;

establishing the correspondence of the timing information to the logical net list to allocate the timing information to the timing-considered cells written in the logical net list;

preparing dummy pin layout-position information indicating positions of the dummy pins in a layout pattern of the timing-considered cells;

performing a floor plan for the timing-considered cells according to the logical net list, the timing information and the dummy pin layout-position information; and performing an automatic layout routing for a result of the floor plan to design a layout pattern of the timing-considered cells in the semiconductor integrated circuit.

5. An automatic cell placement and routing method according to claim 4, wherein the step of establishing the correspondence of a dummy pin to the logical net list comprises the steps of:

placing end point information indicating an end point of a timing check at the boundary as the dummy pin in cases where the boundary is placed on an input pin side of the timing-free cell or in cases where a timing-considered cell, which drives a net connected with an input pin of the timing-free cell, is written in the logical net list; and placing start point information indicating a start point of a timing check at the boundary as the dummy pin in cases where the boundary is placed on an output pin side of the timing-free cell or in cases where a timing-considered cell, which drives a net connected with an output pin of the timing-free cell, is written in the logical net list.

6. An automatic cell placement and routing method according to claim 2, wherein the step of preparing dummy pin layout-position information includes:

indicating an absolute position of each dummy pin in the layout pattern as a first case, relative positions of the dummy pins in the layout pattern as a second case, absolute positions of a part of dummy pins or relative positions of a part of dummy pins as a third case or the combination of the first, second and third cases as a fourth case according to the dummy pin layout-position information, the step of performing a floor plan comprises the steps of:

placing the dummy pins in the layout pattern of the timing-considered cells according to the dummy pin layout-position information;

determining a layout area of the timing-considered cells; and performing the floor plan according to the timing information.

7. An automatic cell placement and routing method according to claim 3, wherein the step of preparing dummy pin layout-position information includes:

indicating an absolute position of each dummy pin in the layout pattern as a first case, relative positions of the dummy pins in the layout pattern as a second case, absolute positions of a part of dummy pins or relative positions of a part of dummy pins as a third case or the combination of the first, second and third cases as a fourth case according to the dummy pin layout-position information, the step of performing a floor plan comprises the steps of:

placing the dummy pins in the layout pattern of the timing-considered cells according to the dummy pin layout-position information;

determining a layout area of the timing-considered cells; and performing the floor plan according to the timing information.

8. An automatic cell placement and routing method according to claim 4, wherein the step of preparing dummy pin layout-position information includes:

indicating an absolute position of each dummy pin in the layout pattern as a first case, relative positions of the dummy pins in the layout pattern as a second case, absolute positions of a part of dummy pins or relative positions of a part of dummy pins as a third case or the combination of the first, second and third cases as a fourth case according to the dummy pin layout-position information, the step of performing a floor plan comprises the steps of:

placing the dummy pins in the layout pattern of the timing-considered cells according to the dummy pin layout-position information;

determining a layout area of the timing-considered cells; and performing the floor plan according to the timing information.

9. An automatic cell placement and routing method according to claim 2, wherein the step of preparing dummy pin layout-position information comprises the steps of:

allocating a name to each dummy pin; and distinguishing the timing-free cell and a group of the timing-considered cells from each other according to the names.

10. An automatic cell placement and routing method according to claim 9, wherein the step of preparing dummy pin layout-position information further comprises the steps of;

determining the whole area of the timing-free cell and the timing-considered cells to be arranged in the semiconductor integrated circuit;

determining a position of the timing-free cell and a position of the group of timing-considered cells in the semiconductor integrated circuit according to a size of the timing-free cell and a size of the group of timing-considered cells; and placing the dummy pins at the boundaries between the timing-free cell and the group of timing-considered cells.

11. An automatic cell placement and routing method according to claim 3, wherein the step of preparing dummy pin layout-position information comprises the steps of:

allocating a name to each dummy pin; and distinguishing the timing-free cell and a group of the timing-considered cells from each other according to the names.

12. An automatic cell placement and routing method according to claim 11, wherein the step of preparing dummy pin layout-position information further comprises the steps of;

determining the whole area of the timing-free cell and the timing-considered cells to be arranged in the semiconductor integrated circuit;

determining a position of the timing-free cell and a position of the group of timing-considered cells in the semiconductor integrated circuit according to a size of the timing-free cell and a size of the group of timing-considered cells; and placing the dummy pins at the boundaries between the timing-free cell and the group of timing-considered cells.

13. An automatic cell placement and routing method according to claim 4, wherein the step of preparing dummy pin layout-position information comprises the steps of:

allocating a name to each dummy pin; and distinguishing the timing-free cell and a group of the timing-considered cells from each other according to the names.

14. An automatic cell placement and routing method according to claim 13, wherein the step of preparing dummy pin layout-position information further comprises the steps of;

determining the whole area of the timing-free cell and the timing-considered cells to be arranged in the semiconductor integrated circuit;

determining a position of the timing-free cell and a position of the group of timing-considered cells in the semiconductor integrated circuit according to a size of the timing-free cell and a size of the group of timing-considered cells; and placing the dummy pins at the boundaries between the timing-free cell and the group of timing-considered cells.

15. An automatic cell placement and routing method according to claim 1, wherein the step of performing an automatic layout routing comprises the steps of:

placing each of the cells written in the logical net list;

determining positions of the dummy pins in the layout pattern of the cells according to relative positions of the cells;

placing the dummy pins at the determined positions;

performing a rough routing for the timing-considered cells according to the placement of the dummy pins; and performing a detailed routing for the timing-considered cells.

16. An automatic cell placement and routing method according to claim 2, wherein the step of performing an automatic layout routing comprises the steps of:

placing each of the cells written in the logical net list;

determining positions of the dummy pins in the layout pattern of the cells according to relative positions of the cells;

placing the dummy pins at the determined positions;

performing a rough routing for the timing-considered cells according to the placement of the dummy pins; and performing a detailed routing for the timing-considered cells.

17. An automatic cell placement and routing method according to claim 3, wherein the step of performing an automatic layout routing comprises the steps of:

placing each of the cells written in the logical net list;

determining positions of the dummy pins in the layout pattern of the cells according to relative positions of the cells;

placing the dummy pins at the determined positions;

performing a rough routing for the timing-considered cells according to the placement of the dummy pins; and performing a detailed routing for the timing-considered cells.

18. An automatic cell placement and routing method according to claim 4, wherein the step of performing an automatic layout routing comprises the steps of:

placing each of the cells written in the logical net list;

determining positions of the dummy pins in the layout pattern of the cells according to relative positions of the cells;

placing the dummy pins at the determined positions;

performing a rough routing for the timing-considered cells according to the placement of the dummy pins; and performing a detailed routing for the timing-considered cells.

19. An automatic cell placement and routing method according to claim 1, wherein the step of performing an automatic layout routing comprises the steps of:

placing each of the cells written in the logical net list;

performing a rough routing for the timing-considered cells;

determining positions of the dummy pins in the layout pattern of the cells according to relative positions of the cells;

placing the dummy pins at the determined positions; and performing a detailed routing for the timing-considered cells according to the placement of the dummy pins.

20. An automatic cell placement and routing method according to claim 2, wherein the step of performing an automatic layout routing comprises the steps of:

placing each of the cells written in the logical net list;

performing a rough routing for the timing-considered cells;

determining positions of the dummy pins in the layout pattern of the cells according to relative positions of the cells;

placing the dummy pins at the determined positions; and performing a detailed routing for the timing-considered cells according to the placement of the dummy pins.

21. An automatic cell placement and routing method according to claim 3, wherein the step of performing an automatic layout routing comprises the steps of:

placing each of the cells written in the logical net list;

performing a rough routing for the timing-considered cells;

determining positions of the dummy pins in the layout pattern of the cells according to relative positions of the cells;

placing the dummy pins at the determined positions; and performing a detailed routing for the timing-considered cells according to the placement of the dummy pins.

22. An automatic cell placement and routing method according to claim 4, wherein the step of performing an automatic layout routing comprises the steps of:

placing each of the cells written in the logical net list;

performing a rough routing for the timing-considered cells;

determining positions of the dummy pins in the layout pattern of the cells according to relative positions of the cells;

placing the dummy pins at the determined positions; and performing a detailed routing for the timing-considered cells according to the placement of the dummy pins.

23. An automatic cell placement and routing method according to claim 1, wherein the step of performing an automatic layout routing comprises the steps of:
  placing each of the cells written in the logical net list;
  performing a rough routing for the timing-considered cells;
  performing a detailed routing for the timing-considered cells;
  determining positions of the dummy pins in the layout pattern of the cells according to relative positions of the cells; and
  placing the dummy pins at the determined positions.

24. An automatic cell placement and routing method according to claim 2, wherein the step of performing an automatic layout routing comprises the steps of:
  placing each of the cells written in the logical net list;
  performing a rough routing for the timing-considered cells;
  performing a detailed routing for the timing-considered cells;
  determining positions of the dummy pins in the layout pattern of the cells according to relative positions of the cells; and
  placing the dummy pins at the determined positions.

25. An automatic cell placement and routing method according to claim 3, wherein the step of performing an automatic layout routing comprises the steps of:
  placing each of the cells written in the logical net list;
  performing a rough routing for the timing-considered cells;
  performing a detailed routing for the timing-considered cells;
  determining positions of the dummy pins in the layout pattern of the cells according to relative positions of the cells; and
  placing the dummy pins at the determined positions.

26. An automatic cell placement and routing method according to claim 4, wherein the step of performing an automatic layout routing comprises the steps of:
  placing each of the cells written in the logical net list;
  performing a rough routing for the timing-considered cells;
  performing a detailed routing for the timing-considered cells;
  determining positions of the dummy pins in the layout pattern of the cells according to relative positions of the cells; and
  placing the dummy pins at the determined positions.

27. An automatic cell placement and routing method according to claim 1, wherein the step of performing an automatic layout routing comprises the steps of:
  placing each of the cells written in the logical net list;
  determining positions of the dummy pins in the layout pattern of the cells according to relative positions of the cells;
  placing the dummy pins at the determined positions;
  performing a rough routing for the timing-considered cells according to the placement of the dummy pins;
  determining optimized positions of the dummy pins;
  changing the placement of the dummy pins to the optimized positions; and
  performing a detailed routing for the timing-considered cells.

28. An automatic cell placement and routing method according to claim 2, wherein the step of performing an automatic layout routing comprises the steps of:
  placing each of the cells written in the logical net list;
  determining positions of the dummy pins in the layout pattern of the cells according to relative positions of the cells;
  placing the dummy pins at the determined positions;
  performing a rough routing for the timing-considered cells according to the placement of the dummy pins;
  determining optimized positions of the dummy pins;
  changing the placement of the dummy pins to the optimized positions; and
  performing a detailed routing for the timing-considered cells.

29. An automatic cell placement and routing method according to claim 3, wherein the step of performing an automatic layout routing comprises the steps of:
  placing each of the cells written in the logical net list;
  determining positions of the dummy pins in the layout pattern of the cells according to relative positions of the cells;
  placing the dummy pins at the determined positions;
  performing a rough routing for the timing-considered cells according to the placement of the dummy pins;
  determining optimized positions of the dummy pins;
  changing the placement of the dummy pins to the optimized positions; and
  performing a detailed routing for the timing-considered cells.

30. An automatic cell placement and routing method according to claim 4, wherein the step of performing an automatic layout routing comprises the steps of:
  placing each of the cells written in the logical net list;
  determining positions of the dummy pins in the layout pattern of the cells according to relative positions of the cells;
  placing the dummy pins at the determined positions;
  performing a rough routing for the timing-considered cells according to the placement of the dummy pins;
  determining optimized positions of the dummy pins;
  changing the placement of the dummy pins to the optimized positions; and
  performing a detailed routing for the timing-considered cells.

31. A semiconductor integrated circuit according to claim 1, wherein the semiconductor integrated circuit comprises:
  the timing-considered cells in which an input timing of a signal is considered and which are placed on a signal path; and
  the timing-free cell in which an input timing of a signal is not considered and which is placed on the signal path on which the timing-considered cells are placed, wherein the layout pattern of the timing-considered cells is designed according to the automatic cell placement and routing method.

32. A semiconductor integrated circuit according to claim 2, wherein the semiconductor integrated circuit comprises:
  the timing-considered cells in which an input timing of a signal is considered and which are placed on a signal path; and
  the timing-free cell in which an input timing of a signal is not considered and which is placed on the signal path on which the timing-considered cells are placed, wherein the layout pattern of the timing-considered cells is designed according to the automatic cell placement and routing method.

33. A semiconductor integrated circuit according to claim 3, wherein the semiconductor integrated circuit comprises:

the timing-considered cells in which an input timing of a signal is considered and which are placed on a signal path; and the timing-free cell in which an input timing of a signal is not considered and which is placed on the signal path on which the timing-considered cells are placed, wherein the layout pattern of the timing-considered cells is designed according to the automatic cell placement and routing method.

34. A semiconductor integrated circuit according to claim 4, wherein the semiconductor integrated circuit comprises:

the timing-considered cells in which an input timing of a signal is considered and which are placed on a signal path; and the timing-free cell in which an input timing of a signal is not considered and which is placed on the signal path on which the timing-considered cells are placed, wherein the layout pattern of the timing-considered cells is designed according to the automatic cell placement and routing method.

* * * * *